(12) United States Patent
Huang et al.

(10) Patent No.: US 8,507,979 B1
(45) Date of Patent: Aug. 13, 2013

(54) SEMICONDUCTOR INTEGRATED CIRCUIT WITH METAL GATE

(75) Inventors: Yuan-Sheng Huang, Taichung (TW); Ming-Ching Chang, Hsinchu (TW); Chao-Cheng Chen, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/563,470

(22) Filed: Jul. 31, 2012

(51) Int. Cl.
*H01L 29/66* (2006.01)
(52) U.S. Cl.
USPC ........... 257/330; 257/334; 438/248; 438/259; 438/270
(58) Field of Classification Search
USPC ................. 257/330, 335; 438/248, 259, 270
See application file for complete search history.

(56) References Cited

U.S. PATENT DOCUMENTS

2010/0314682 A1* 12/2010 Yilmaz et al. ................. 257/328

* cited by examiner

*Primary Examiner* — Tan N Tran
(74) *Attorney, Agent, or Firm* — Haynes and Boone, LLP

(57) ABSTRACT

A method of fabricating a semiconductor integrated circuit (IC) is disclosed. The method includes providing a semiconductor substrate and forming a gate trench therein. The method also includes filling in the gate trench partially with a work-function (WF) metal stack, and filling in the remaining gate trench with a dummy-filling-material (DFM) over the WF metal stack. A sub-gate trench is formed by etching-back the WF metal stack in the gate trench, and is filled with an insulator cap to form an isolation region in the gate trench. The DFM is fully removed to from a MG-center trench (MGCT) in the gate trench, which is filled with a fill metal.

20 Claims, 11 Drawing Sheets

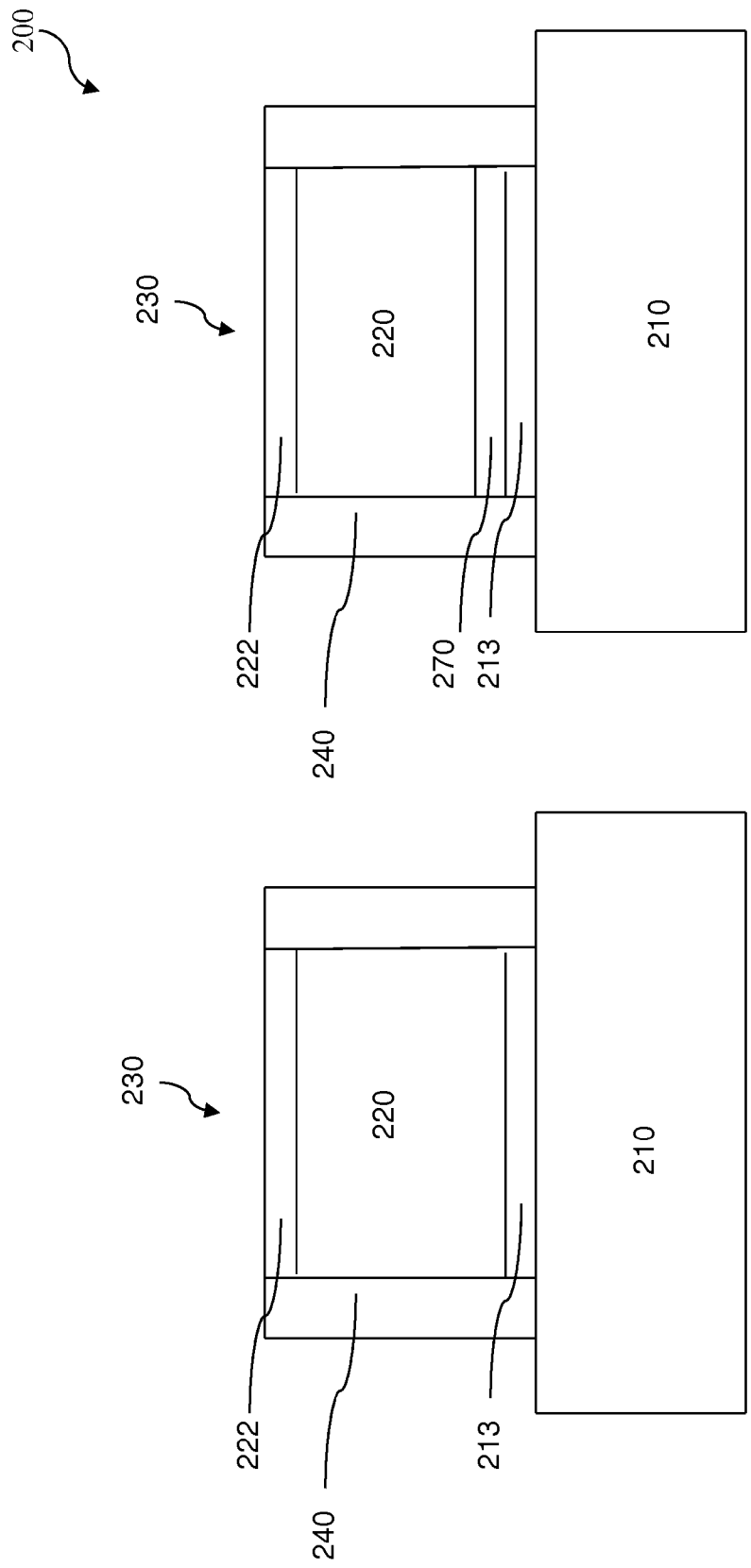

SEMICONDUCTOR INTEGRATED CIRCUIT WITH METAL GATE

BACKGROUND

The semiconductor integrated circuit (IC) industry has experienced exponential growth. Technological advances in IC design and material have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example, when a semiconductor device such as a metal-oxide-semiconductor field-effect transistor (MOSFET) is scaled down through various technology nodes, high-k (HK) dielectric material and metal gate (MG) are often considered to form a gate stack for a field-effect transistor (FET). Integration issues occur when forming a MG, such as a need to pair work-function (WF) metals with a fill metal for a MG etching process. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2 to 11 are cross-sectional views of an example semiconductor integrated circuit (IC) at fabrication stages constructed according to the method of FIG. 1.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
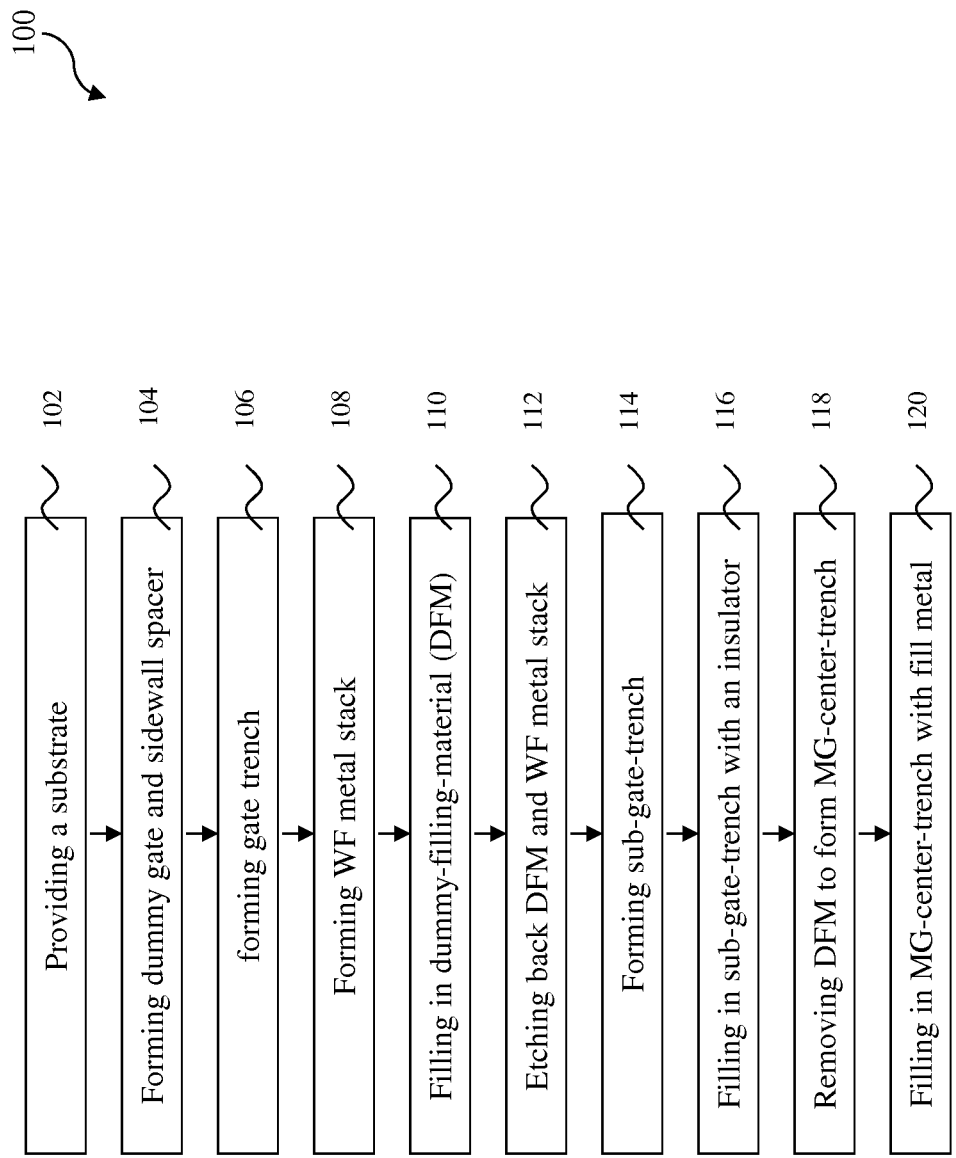
FIG. 1 is a flowchart of an example method for fabricating a semiconductor integrated circuit (IC) constructed according to various aspects of the present disclosure.

FIG. 1 is a flowchart of one embodiment of a method 100 of fabricating one or more semiconductor integrated circuits (ICs) according to aspects of the present disclosure. The method 100 is discussed in detail below, with reference to a semiconductor device 200 shown in FIGS. 2 and 11 for the sake of example.

The method 100 begins at step 102 by providing a semiconductor substrate 210. The semiconductor substrate 210 may include silicon, germanium, silicon germanium, gallium arsenide or other appropriate semiconductor materials. Alternatively, the semiconductor substrate 210 may include an epitaxial layer. Further, the semiconductor substrate 210 may be strained for performance enhancement. Furthermore, the semiconductor substrate 210 may include a semiconductor-on-insulator (SOI) structure such as a buried dielectric layer. Also alternatively, the semiconductor substrate 210 may include a buried dielectric layer such as a buried oxide (BOX) layer, such as that formed by a method referred to as separation by implantation of oxygen (SIMOX) technology, wafer bonding, SEG, or other appropriate methods. The semiconductor substrate 210 may also include a fin structure of a fin-like field-effect transistor (FinFET) formed by suitable processes, such as lithography patterning process and etching process. In fact various embodiments may include any of a variety of substrate structures and materials.

The semiconductor substrate 210 also includes various doped regions (not shown) formed by implantation techniques. For example, a portion of the semiconductor substrate 210 is doped to form a P-type region and a P-well where an n-channel device will be fabricated. Similarly, another portion of the semiconductor substrate 210 is doped to form an N-type region and an N-well where a p-channel device will be fabricated. The doped regions are doped with P-type dopants, such as boron or $BF_2$, and/or N-type dopants, such as phosphorus or arsenic. The doped regions may be formed directly on the semiconductor substrate 210, in a P-well structure, in an N-well structure, in a dual-well structure, or using a raised structure.

The semiconductor substrate 210 also includes various isolation features, such as shallow trench isolation (STI), formed in the substrate 210 to separate various devices. The formation of the STI may include etching a trench in the semiconductor substrate 210, filling the trench by dielectric materials such as silicon oxide, silicon nitride, or silicon oxynitride and using chemical mechanical polishing (CMP) to remove the excessive dielectric metals layers.

The method 100 proceeds to step 104 by forming a gate stack 230 and sidewall spacers 240 on the semiconductor substrate 210, as shown in FIGS. 2A and 2B. In one embodiment, an interfacial layer (IL) 213 is deposited on the semiconductor substrate 210 by any appropriate method, such as atomic layer deposition (ALD), chemical vapor deposition CVD and ozone oxidation. The IL 213 includes oxide, HfSiO and oxynitride. It has been observed that an IL may provide a remedy for some HK dielectric gate stack integration issues, such as threshold voltage pinning and reducing carrier mobility. The IL 213 may also be important as a diffusion barrier to prevent undesirable interface reactions between the HK dielectric material and the substrate.

In one embodiment, a HK-last scheme is employed. A gate material 220, such as polysilicon, is disposed over the IL 213 by deposition techniques known in the art, as shown in FIG. 2A. Alternatively, an amorphous silicon layer may optionally be formed instead of the polysilicon layer. The gate material 220 may be referred to as a dummy gate 220 since it will be replaced by a metal gate (MG) in downstream processes. A HK dielectric layer will be formed later, for example, after high thermal budget processes are performed.

In another embodiment, a HK-first scheme is employed. A HK dielectric layer 270 is deposited on the IL 213, which will be described in details later, and the dummy gate 220 is deposited on the HK dielectric layer 270, as shown in FIG. 2B.

Additionally a patterned hard mask 222 is formed on the dummy gate 220. The patterned hard mask 222 includes silicon nitride and/or silicon oxide, or alternatively photoresist. The patterned hard mask 222 may include multiple layers. The patterned hard mask 222 is patterned by a photolithography process and an etching process.

By using the patterned hard mask 222 as an etch mask, an etching process is applied to form a gate stack 230. The etching process includes a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile.

After the gate stack 230 is formed, sidewall spacers 240 are formed on the sidewalls of the gate stack 230, as shown in FIGS. 2A and 2B. The sidewall spacers 240 may include a dielectric material such as silicon oxide, silicon nitride, silicon carbide, silicon oxynitride, or combinations thereof. In one embodiment, each sidewall spacers 240 is formed by multiple layers or multiple spacers. For example, a seal spacer is formed on the sidewall of the gate stack 230 first, then a main spacer is formed on the seal spacer. The sidewall spacers 240 may be formed by deposition and etch processes in a conventional manner.

The method 100 proceeds to step 106 by removing the dummy gate 220 to form a gate trench 260. In one embodiment, before removing the dummy gate 220, an interlayer dielectric (ILD) layer 250 is formed between the gate stacks 230 on the semiconductor substrate 210. The ILD layer 250 includes silicon oxide, oxynitride or other suitable materials. The ILD layer 250 includes a single layer or multiple layers. The ILD layer 250 is formed by a suitable technique, such as CVD, ALD and spin-on (SOG). A CMP process may be applied to remove excessive ILD layer 250 and expose the top surface of the dummy gate 220 to a subsequent dummy gate removing process.

Figure 3B:
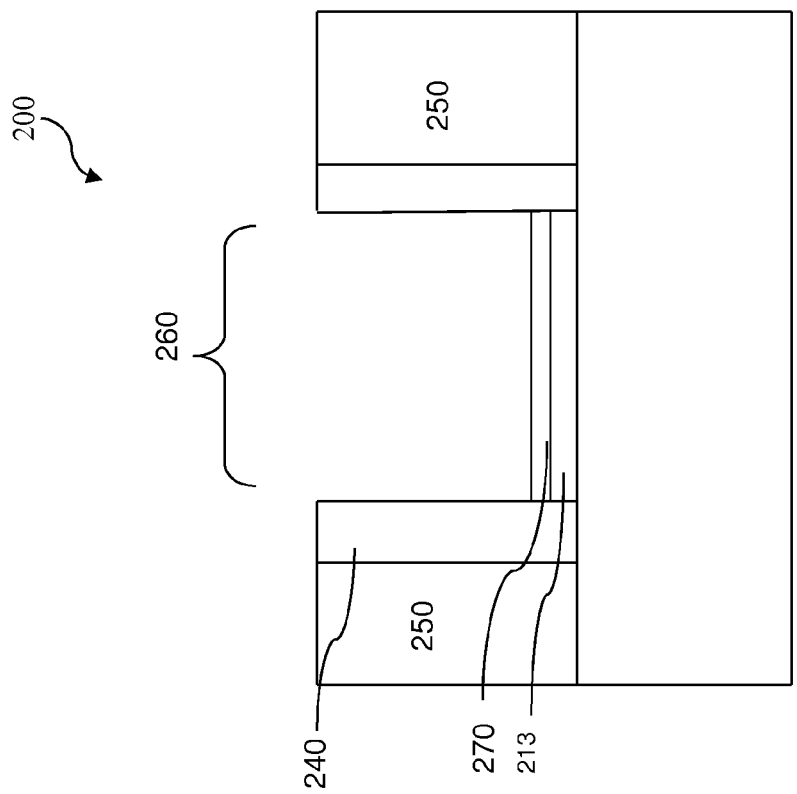
Figure 3A:
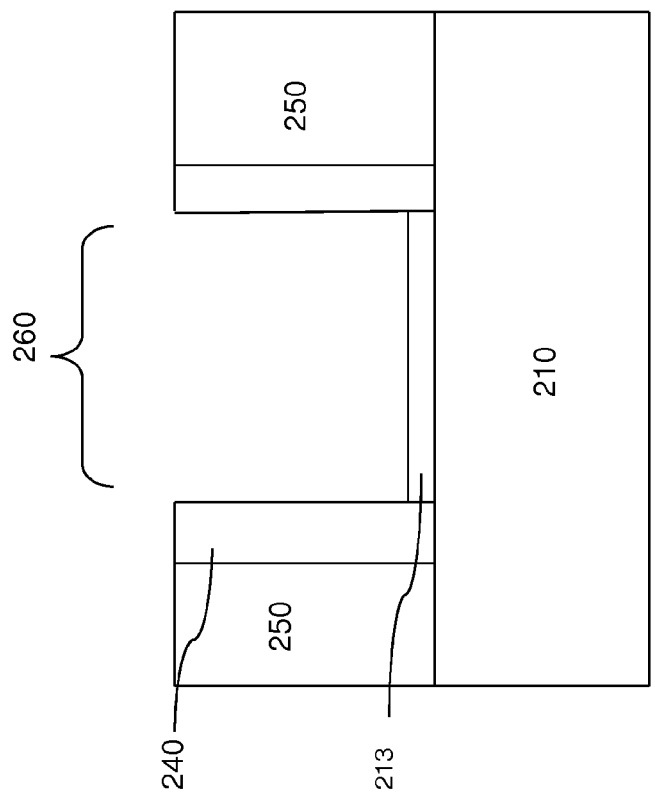

In the present disclosure, a replacement gate (RPG) process scheme is employed. Generally, in a RPG process scheme, a dummy polysilicon gate is formed first and is replaced later by a MG after high thermal budget processes are performed. In one of embodiment of the HK-last scheme, the dummy gate 220 is removed to form the gate trench 260 with the sidewall spacer 240 as its sidewall, as shown in FIG. 3A. In another embodiments of the HK-last scheme, the IL 213 is removed as well. Alternatively, in one of embodiments of the HK-first scheme, the dummy gate 220 is removed while the IL 213 and the HK dielectric layer 270 retain, as shown in FIG. 3B. The dummy gate 220 (the IL 213 and the HK dielectric layer 270) may be removed by dry etch, wet etch, or a combination of dry and wet etch. For example, a wet etch process may include exposure to a hydroxide containing solution (e.g., ammonium hydroxide), deionized water, and/or other suitable etchant solutions.

The method 100 proceeds to step 108 by forming a work-function (WF) metal stack 280 in the gate trench 260. In one of embodiments of the HK-last scheme, after high temperature processes have been applied in formations of, such as source and drain regions, the HK dielectric layer 270 is deposited on the IL 213. In another of embodiments of the HK-last scheme, another IL layer is deposited first if the IL 213 is removed in a previous process step. The HK dielectric layer 270 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. The HK dielectric layer 270 is deposited by suitable techniques, such as ALD, CVD, physical vapor deposition (PVD), thermal oxidation, combinations thereof, or other suitable techniques. Alternatively, in one of embodiments of the HK-first scheme, the HK dielectric layer 270 is formed in step 104 before deposition of the dummy gate 220. Additionally, a post HK dielectric layer deposition annealing may be performed to enhance moisture control in gate dielectrics.

Figure 4:
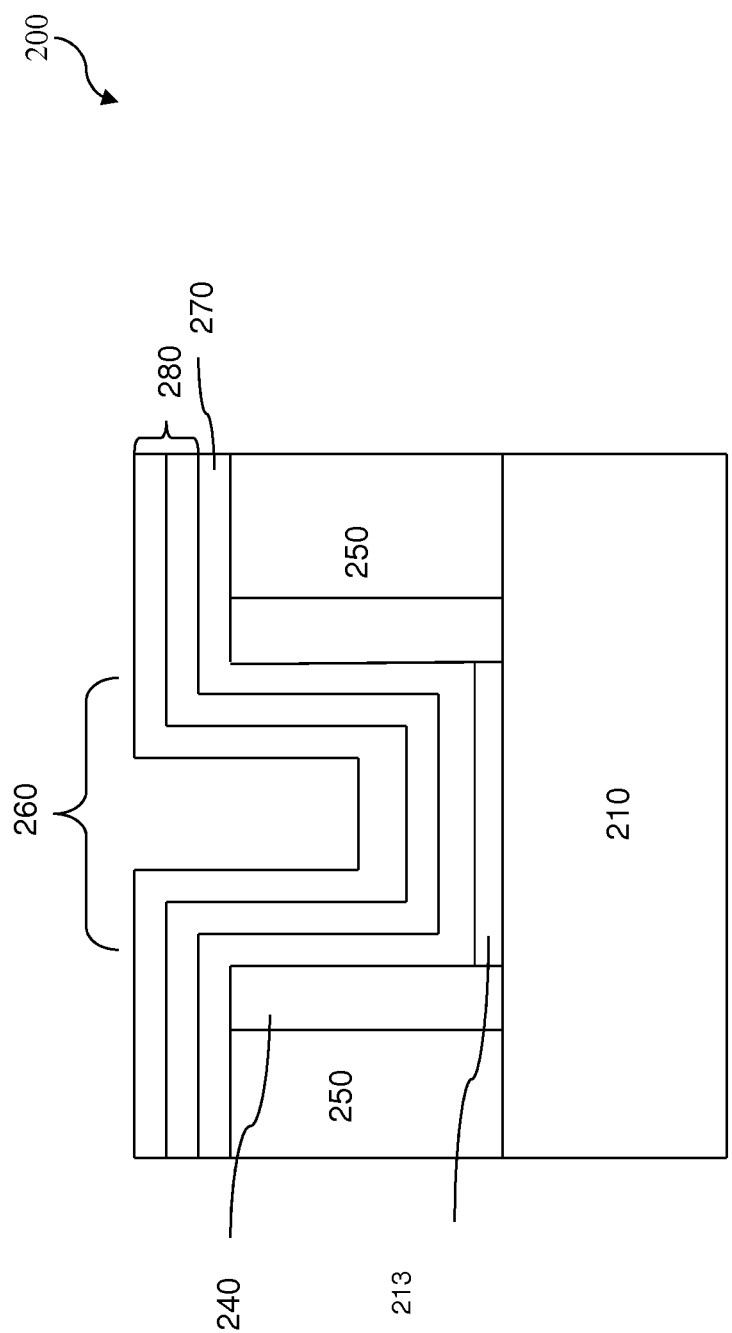

The WF metal stack 280 is formed by filling in the gate trench 260 with WF metal materials, as shown in FIG. 4 (From now on, for the sake of simplicity, only HK-last scheme is shown because following processes in the HK-first scheme is substantially similar with ones in the HK-last scheme). The WF metal stack 280 may include a single layer or multi layers, such as a WF layer, a liner layer, a wetting layer, and an adhesion layer. The WF metal stack 280 may include Ti, TiAlN, TaC, TaCN, TaSiN, Mn, Zr, TiN, TaN, Ru, Mo, WN, or any suitable materials. The WF metal stack 280 may be formed by ALD, PVD, CVD, or other suitable process. After the WF metal stack 280 formation, the gate trench 260 is partially filled.

Figure 5:
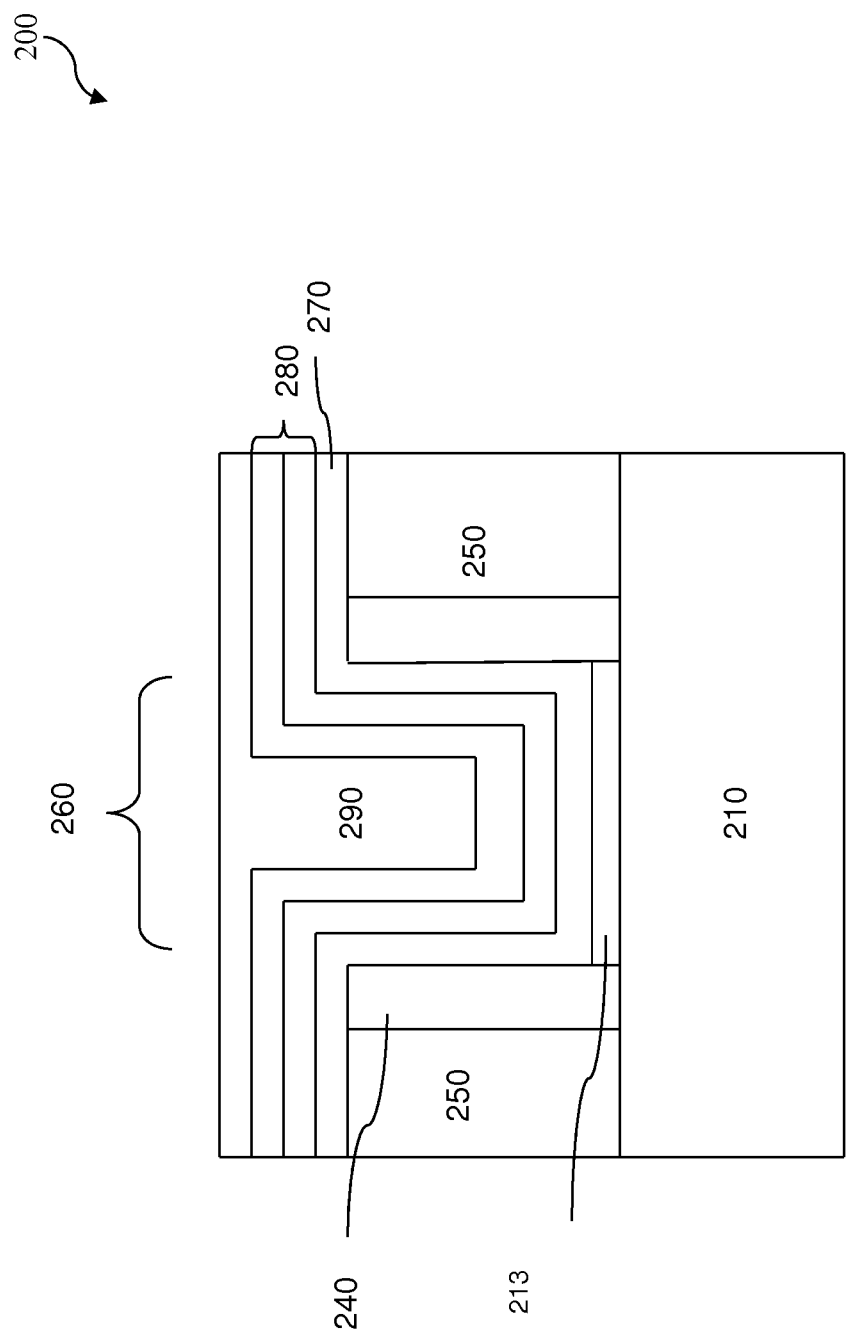

The method 100 proceeds to step 110 by filling in the remaining gate trench 260 with a dummy-filling-material (DFM) 290 over the WF metal stack 280, as shown in FIG. 5. In one embodiment, the DFM 290 is designed to use a material such that it has a substantially different etch rate with respect to materials of the WF metal stack 280 in a subsequent WF metal stack etch-back process, which will be described in detail later. The DFM 290 may include dielectric materials such as silicon oxide, silicon nitride, oxynitride, flowable oxide or other suitable materials. The DFM 290 is formed by a suitable technique, such as CVD, ALD and spin-on-glass (SOG).

Figure 6:
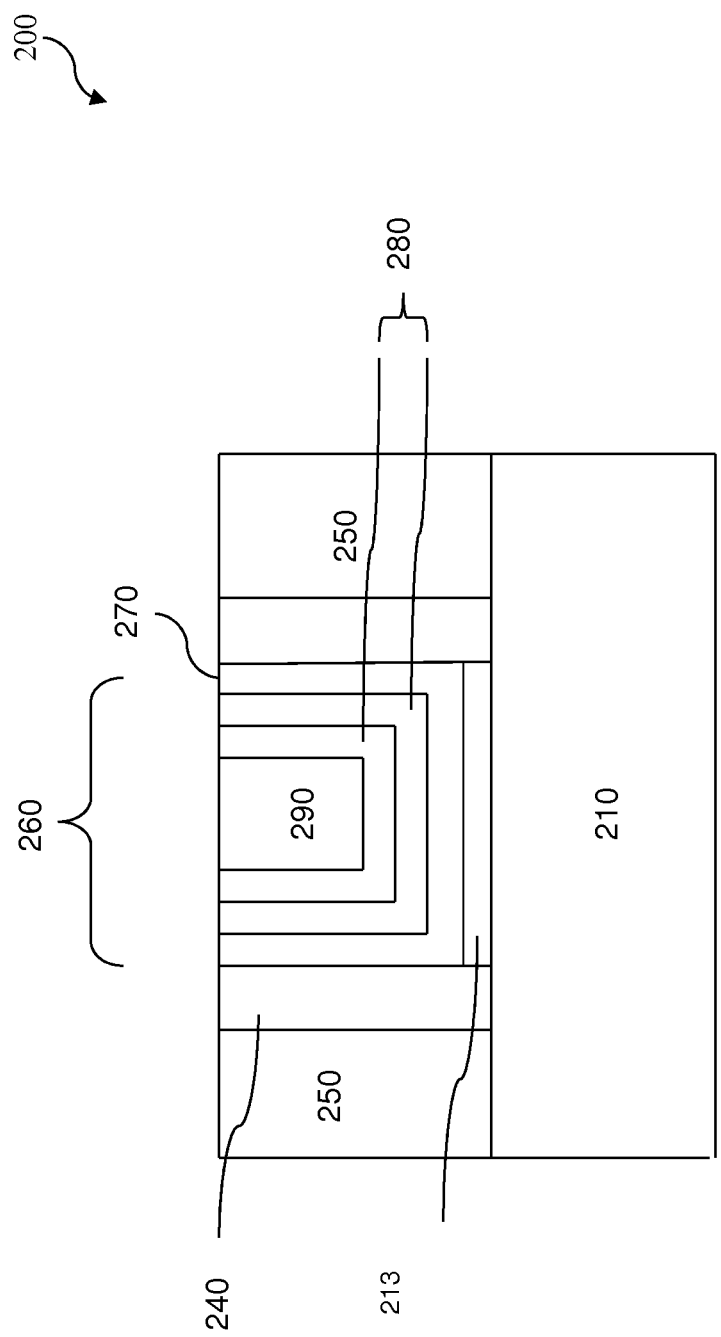

The method 100 proceeds to step 112 by polishing back the DFM 290 and the WF metal stack 280, as shown in FIG. 6. A CMP process may be applied to remove excessive the DFM 290 and the WF metal stack 280 to provide a substantially planar top surface for the DFM 290 and the WF metal stack 280 with the ILD layer 250. The CMP process may includes an in-situ CMP or two separate CMP processes. Alternatively, the DFM 290 is etched back first by dry etch, wet etch, or a combination of dry and wet etch and followed by a CMP to etch-back the WF metal stack 280.

Figure 7:
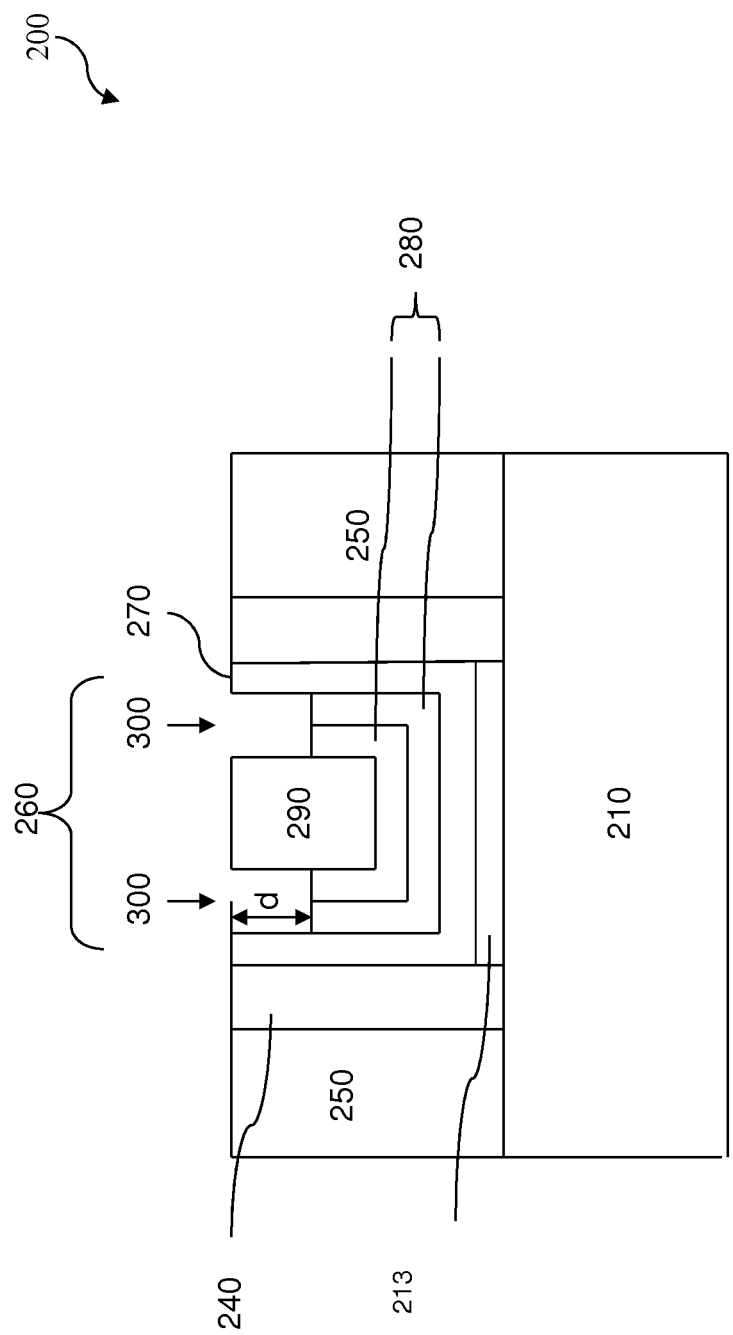

The method 100 proceeds to step 114 by forming a sub-gate-trench 300 around the DFM in the gate trench 260. The DFM remains intact during the formation of the sub-gate-trench 300. In one embodiment, the sub-gate-trench 300 is formed by recessing the WF metal stack 280 further in the gate trench 260, as shown in FIG. 7. In another embodiment, the sub-gate-trench 300 is formed by recessing the WF metal stack 280 and the HK dielectric layer 270 (not shown). In yet another embodiment, the sub-gate-trench 300 is formed by recessing the WF metal stack 280, the HK dielectric layer 270 and the sidewall spacers 240 (not shown). A depth (d) of the sub-gate-trench 300 is controlled to achieve a predetermined target of the semiconductor device 200 performance. The recessing process may be configured to have a substantially high etch selectivity with respect to the DFM 290. The selective etching includes dry etch, wet etch, or a combination of dry and wet etch. With etching selectivity, the sub-gate-trench 300 can be formed with a self-align characteristic. Alternatively, the sub-gate-trench 300 may also be formed by lithography and etching processes.

Figure 8:
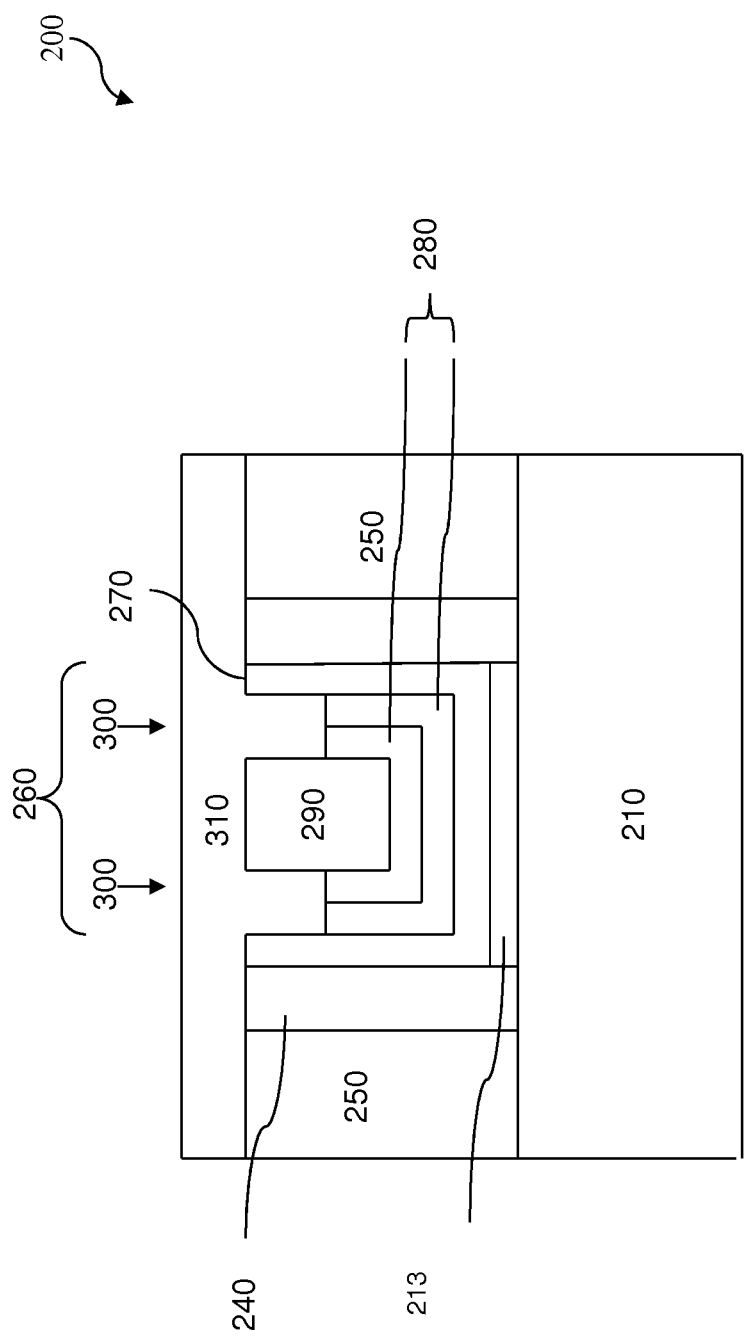
Figure 9:
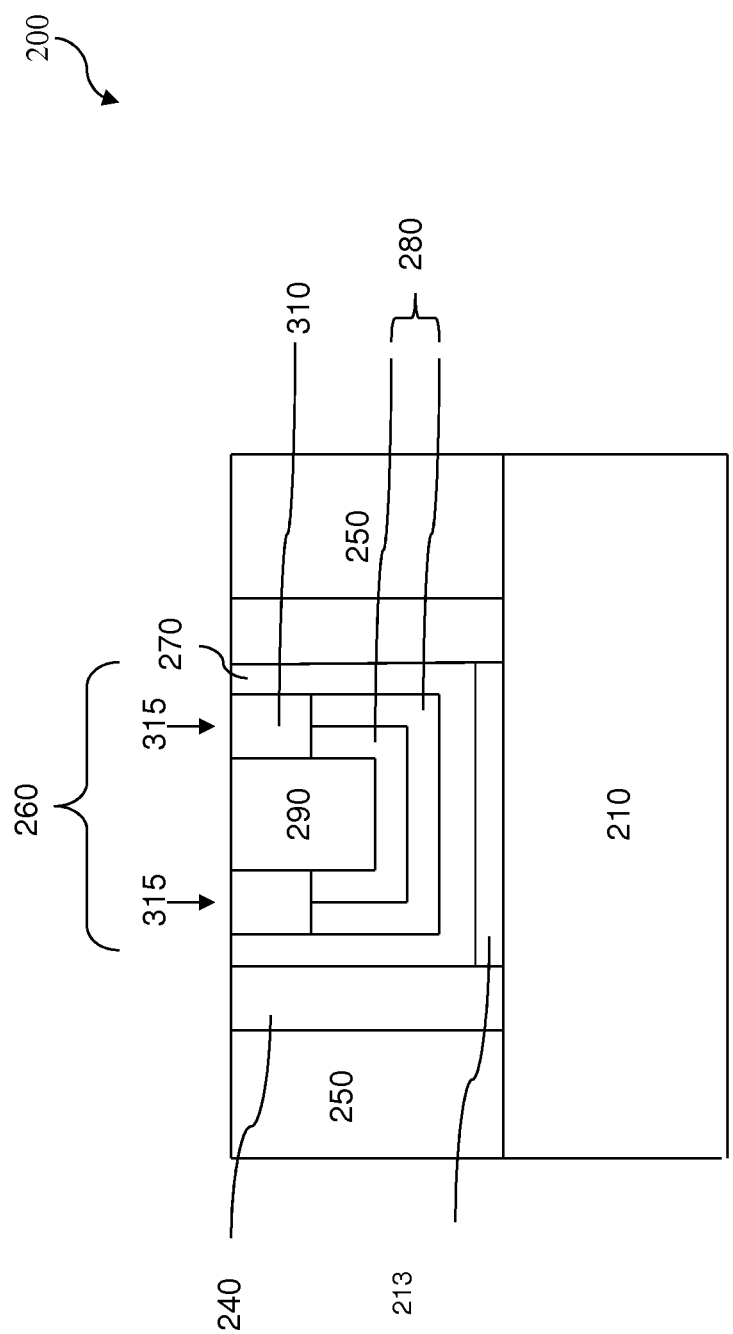

The method 100 proceeds to step 116 by filling in the sub-gate-trench 300 with an insulator capping layer 310 to form an isolation region 315, as shown in FIG. 8. The insulator capping layer 310 includes silicon oxide, silicon nitride, silicon carbide, oxynitride or other suitable materials. The insulator capping layer 310 is configured in such that a substantially etch rate different with respect to the material of the DFM 290 is obtained in a subsequent etching process of removing the DFM 290, which will be described in detail later. In one embodiment, a CMP process is applied to remove excessive the insulator capping layer 310 to expose the top surface of the DFM 290 for a subsequent etching process, as shown in FIG. 9.

Figure 10:
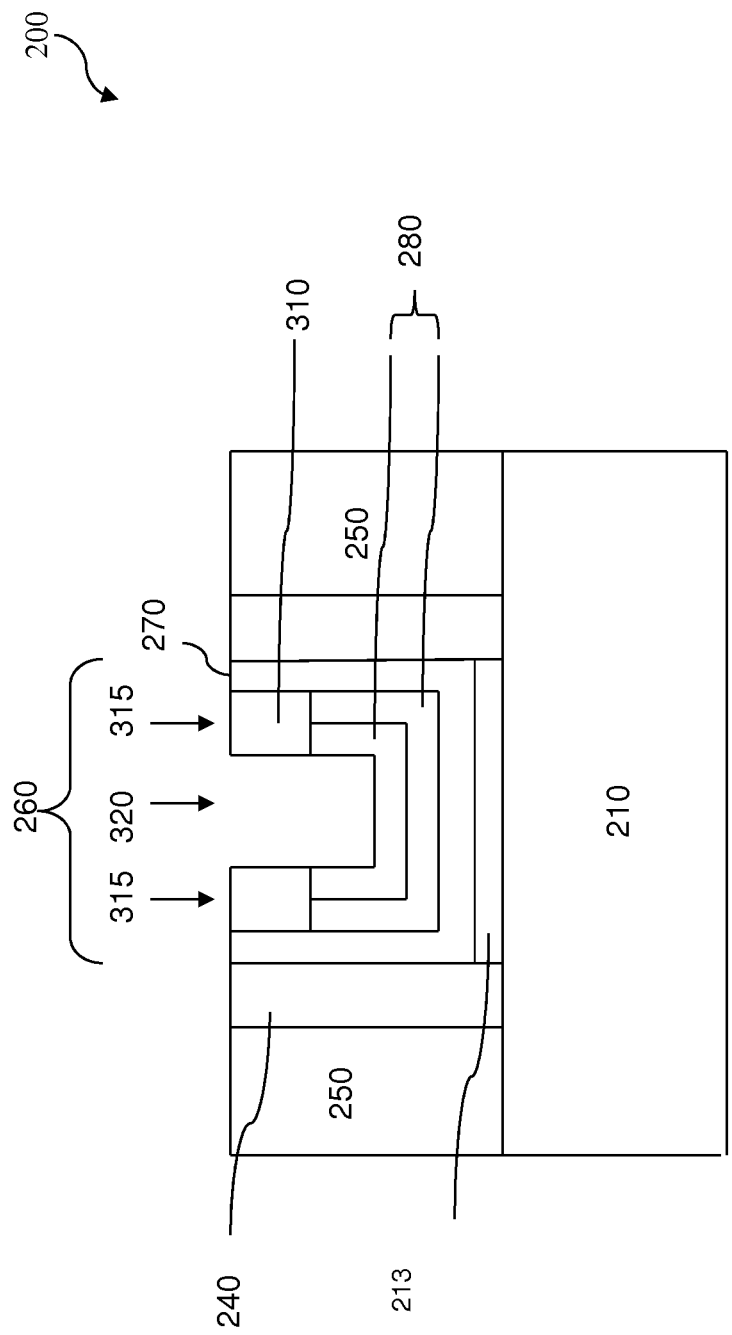

The method 100 proceeds to step 118 by fully removing the DFM 290 to form a MG-center-trench (MGCT) 320 in the center of the gate trench 260, as shown in FIG. 10. In one embodiment, the etching process is configured to have a substantially high etch selectivity of the DFM 290 with respect to the WF metal stack 280 and the insulator capping layer 310. The WF metal stack 280 and the isolation region 315 remain fairly intact during the DFM removal. The etching removes the DFM 290 completely to form the MGCT 320. The selective etching includes dry etch, wet etch, or a combination of dry and wet etch. With etching selectivity, the MGCT trench 320 can be formed with a self-align characteristic. In another embodiment, the MGCT 320 is formed by patterning and etching processes in a conventional manner. The MGCT 320 is formed in the middle of the gate trench 260 with a lower portion formed by the WF metal stack 280 and an upper portion formed by the isolation region 315.

Figure 11:
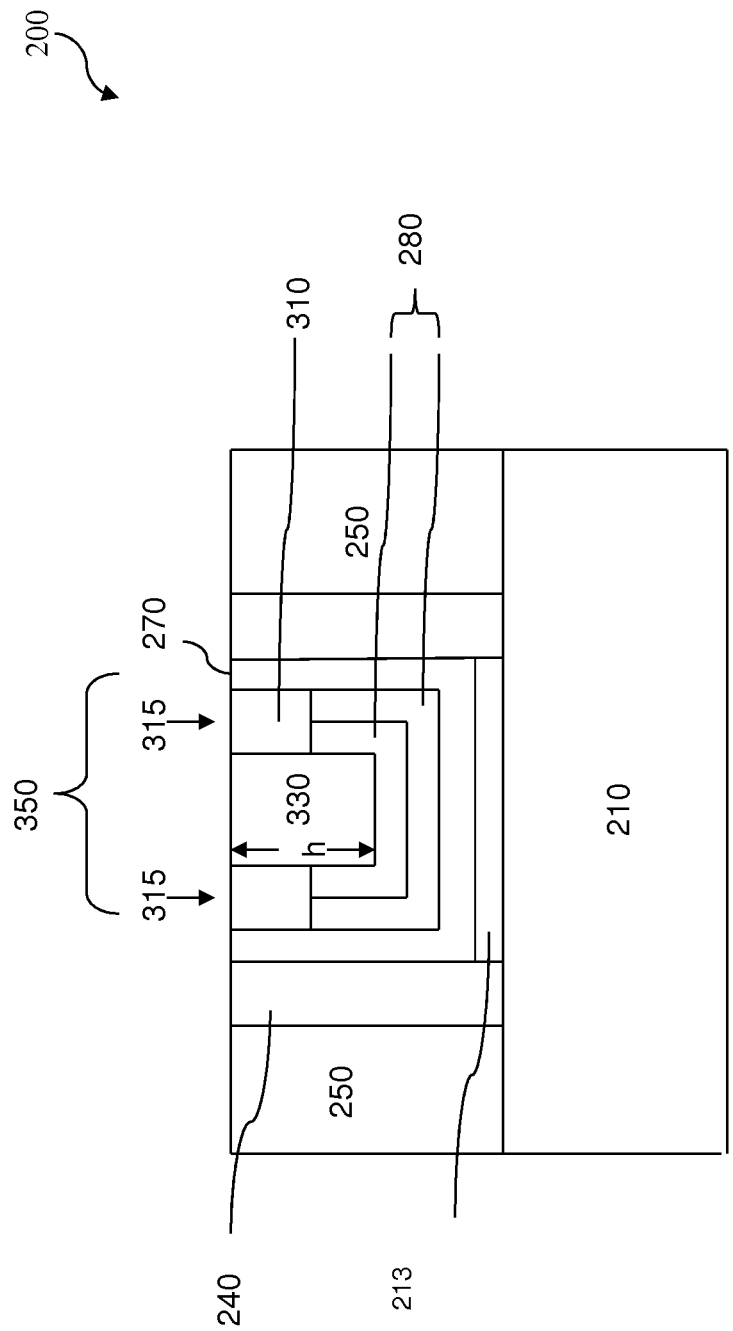

The method 100 proceeds to step 120 by filling in the MGCT 320 with a fill metal 330, as shown in FIG. 11. The fill metal 330 may include aluminum (Al), copper (Cu) or tungsten (W) or other suitable conductive material. The fill metal 330 is deposited by ALD, PVD, CVD, or other suitable process. With both of the fill metal 330 and the WF metal stack 280, a MG 350 is formed, as shown in FIG. 11. Additionally, the fill metal 330 is etched back to a predetermined height (h) to obtain adjustment of gate resistance. In one embodiment, a metal CMP process is applied to remove excessive the fill metal 330 to provide a substantially planar top surface for the fill metal 330, the insulator capping layer 310 and the ILD layer 250. Since the top surface of the MG 350 includes top surface of the isolation region 315, the amount of metal area is reduced to the metal CMP process and it results in a CMP dishing reduction. The MG 350 is formed over the HK dielectric layer 270 and the IL 213, referred to as a gate dielectric stack. The MG 350 is formed in such that having a center region surrounded by an edge region. Wherein the upper portion of the center region is formed by the fill metal 330, the upper portion of the edge region is formed by the isolation region 315, the lower portion of both of center and edge region is formed by the WF metal stack.

The method 100 may further include forming source/drain (S/D) regions by a proper technique, such as one or more ion implantations. The S/D regions may further include lightly doped (LDD) and a heavily doped regions. After the formation of the source and drain (S/D) regions, one or more annealing processes may be performed. The annealing processes may include rapid thermal anneal (RTA), laser anneal, or other suitable annealing processes. In one embodiment, the S/D regions includes epitaxially grown semiconductor material to from strained structures for a proper strain effect, leading to enhance carrier mobility. The method to form the strained structure includes applying etching process to form recesses in the semiconductor substrate 210 and epitaxially growing a crystalline semiconductor material in the recesses.

The method 100 may also further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

Based on the above, it can be seen that the present disclosure offers a method of IC fabrication with a scheme of a dummy-filling-material (DFM) filling-in and removing. By incorporating with DFM, the formation of the WF metal stack can be separated with the formation of the fill metal. It significantly relaxed process constrains in MG etching, such as requiring a suitable paring of materials of the WF metals with the fill metals for simultaneously fulfilling requirements of IC device performance and the MG etching process. The method has demonstrated significantly reducing metal CMP dishing and WF metal recess failure in MG formation. A MG is formed by the method in such that with adjustable fill metal height and WF metal stack height to fulfill requirement of device performance.

The present disclosure provides many different embodiments of fabricating a semiconductor IC that provide one or more improvements over the prior art. In one embodiment, a method for fabricating a semiconductor integrated circuit (IC) includes providing a semiconductor substrate having a gate trench. The method also includes filling in the gate trench partially with a work-function (WF) metal stack, filling in the remaining gate trench with a dummy-filling-material (DFM) over the WF metal stack, forming a sub-gate-trench around the DFM in the gate trench, filling in the sub-gate trench with an insulator capping layer to form an isolation region in the gate trench, then fully removing the DFM to from a MG-center trench (MGCT) in the gate trench and filling in the MGCT with a fill metal.

In another embodiment, a semiconductor IC fabricated by the method of the present disclosure includes a semiconductor substrate, a gate dielectric stack formed on the semiconductor substrate, a metal gate (MG) stack formed over the gate dielectric stack; wherein the MG stack having a center region surrounded by an edge region, a fill metal formed in an upper portion of the center region of the MG stack, an isolation region formed in the upper portion of edge region of the MG stack and a work-function (WF) metal stack formed lower portion of both of the center and edge regions of the MG stack.

In another embodiment, a method for fabricating a semiconductor integrated circuit (IC) includes providing a semiconductor substrate, forming a dummy gate on the semiconductor substrate, forming a sidewall spacer on the dummy gate, removing the dummy gate to form a gate trench, filling in the gate trench partially with a work-function (WF) metal stack, filling in the remaining gate trench with a dummy-filling-material (DFM) over the WF metal stack, removing a portion of the WF metal stack to forming a sub-gate-trench with a predetermined depth (d) in the gate trench, filling in the sub-gate-trench with an insulator capping layer to form an isolation region in the gate trench, fully removing the DFM from the gate trench to from a MG-center trench (MGCT) in the gate trench and filling in the MGCT with a fill metal; and etch-back the fill meter to a predetermined metal height (h).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   providing a semiconductor substrate having a gate trench;
   partially filling in the gate trench with a work-function (WF) metal stack;
   filling in the remaining gate trench with a dummy-filling-material (DFM) over the WF metal stack;
   forming a sub-gate-trench in the gate trench while retaining the DFM;
   filling the sub-gate-trench with an insulator capping layer to form an isolation region in the gate trench;
   fully removing the DFM to form a MG-center trench (MGCT) in the center of gate trench; and
   filling in the MGCT with a fill metal.

2. The method of claim 1, wherein the semiconductor substrate includes:
   an interfacial layer (IL) on the semiconductor substrate;
   a high-k (HK) dielectric layer over the IL; and
   a sidewall spacer as the sidewall of the gate trench.

3. The method of claim 1, wherein the sub-gate-trench is formed by an etching process having a etch selectivity respective to the DFM, wherein the DFM remain at least partially intact during the etching process.

4. The method of claim 3, wherein the etching process removes a portion of WF metal stack to form the sub-gate-trench with a self-align characteristic.

5. The method of claim 1, wherein the DFM includes dielectric materials.

6. The method of claim 1, wherein the sub-gate-trench is formed by recessing the WF metal stack and the HK dielectric layer.

7. The method of claim 1, wherein the sub-gate-trench is formed by recessing the WF metal stack, the HK dielectric layer and the sidewall spacer.

8. The method of claim 1, wherein a depth (d) of the sub-gate-trench is controlled to achieve a predetermined target of a device performance.

9. The method of claim 1, further comprising:
   after filling in the sub-gate-trench with the insulator capping layer, applying a chemical mechanical polishing (CMP) to remove excessive portions of the insulator capping layer to expose a top surface of the DFM.

10. The method of claim 1, wherein the insulator capping layer includes materials having a substantial different etch rate than the DFM.

11. The method of claim 10, wherein the DFM is removed by an etch-back process having an etch selectivity with respect to the insulator capping layer.

12. The method of claim 1, further comprising:
   after filling in the MGCT with the fill metal, applying a CMP to remove excessive fill metal to achieve a predetermined fill metal height (h).

13. A semiconductor integrated circuit (IC), the IC comprising:
   a semiconductor substrate;
   a gate dielectric stack formed on the semiconductor substrate;
   a metal gate (MG) stack formed over the gate dielectric stack; wherein the MG stack has a center region surrounded by an edge region;
   a fill metal formed in an upper portion of the center region of the MG stack;
   an isolation region formed in the upper portion of edge region of the MG stack; and
   a work-function (WF) metal stack formed in lower portions of both the center and edge regions of the MG stack.

14. The IC of claim 13, wherein the gate dielectric stack includes:
   an interfacial layer (IL) disposed on the semiconductor substrate; and
   a high-k (HK) dielectric layer disposed over the IL.

15. The IC of claim 13, further comprising:
   a sidewall spacer on the MG stack and the gate dielectric stack.

16. A method for fabricating a semiconductor integrated circuit (IC), the method comprising:
   providing a semiconductor substrate;
   forming a dummy gate on the semiconductor substrate;
   forming a sidewall spacer on the dummy gate;
   removing the dummy gate to form a gate trench;
   filling in the gate trench partially with a work-function (WF) metal stack;
   filling in the remaining gate trench with a dummy-filling-material (DFM) over the WF metal stack;
   forming a sub-gate-trench with a predetermined depth (d) around the DFM in the gate trench;
   filling in the sub-gate-trench with an insulator capping layer to form an isolation region in the gate trench;
   after the isolation region formation, fully removing the DFM from the gate trench to form a MG-center trench (MGCT) in the gate trench;
   filling in the MGCT with a fill metal; and
   etching-back the fill metal to a predetermined metal height (h).

17. The method of claim 16, wherein the DFM includes materials having a substantially different etch rate than the material of the WF metal stack.

18. The method of claim 17, wherein the DFM remains fairly intact during the formation of the sub-gate-trench.

19. The method of claim 16, wherein the isolation region is formed by a material having a substantially different etch rate than the DFM.

20. The method of claim 19, wherein the isolation region remains intact during the DFM removal.

* * * * *